(12) United States Patent
Yoon et al.

(10) Patent No.: US 10,586,918 B2
(45) Date of Patent: Mar. 10, 2020

(54) MAGNETIC FIELD EFFECT TRANSCONDUCTORS

(71) Applicant: UNIVERSITY OF FLORIDA RESEARCH FOUNDATION, INC., Gainesville, FL (US)

(72) Inventors: Yong Kyu Yoon, Gainesville, FL (US); Arian Rahimi, Gainesville, FL (US)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 0 days.

(21) Appl. No.: 16/024,468

(22) Filed: Jun. 29, 2018

(65) Prior Publication Data

US 2019/0051821 A1 Feb. 14, 2019

Related U.S. Application Data

(60) Provisional application No. 62/526,785, filed on Jun. 29, 2017.

(51) Int. Cl.
| | |
|---|---|
| *H01L 43/10* | (2006.01) |
| *H01L 29/82* | (2006.01) |
| *H01L 43/02* | (2006.01) |
| *H01L 27/22* | (2006.01) |

(52) U.S. Cl.
CPC ............ *H01L 43/10* (2013.01); *H01L 27/224* (2013.01); *H01L 29/82* (2013.01); *H01L 43/02* (2013.01)

(58) Field of Classification Search
CPC ............... H01L 29/82; H01L 43/00–14; H01L 27/22–228; H02K 17/90
See application file for complete search history.

(56) References Cited

U.S. PATENT DOCUMENTS

2014/0113828 A1 * 4/2014 Gilbert ............... G01R 33/0354
505/100

* cited by examiner

*Primary Examiner* — Amar Movva
(74) *Attorney, Agent, or Firm* — Alston & Bird LLP

(57) ABSTRACT

A magnetic field effect transconductor device (M-FET) capable of carrying a modulated current when receiving an external magnetic field includes at least a ferromagnetic layer and a non-ferromagnetic layer disposed on the ferromagnetic layer; the non-ferromagnetic layer has a first skin depth of the current and a first thickness smaller than the first skin depth; and the ferromagnetic layer has a second skin depth of the current and a second thickness smaller than the second skin depth. Applying an external DC magnetic field along the longitudinal axis of the device and an AC EM wave propagating in the same direction as the DC field, the M-FET demonstrates frequency dependent current switching device. A method for making the transconductor includes depositing a photoresist over transconductors and patterning the photoresist, or depositing transconductors over a patterned photoresist and performing a lift off process.

19 Claims, 5 Drawing Sheets

Top

Bottom

MAGNETIC FIELD EFFECT TRANSCONDUCTORS

CROSS-REFERENCE TO RELATED APPLICATIONS

The present application claims priority to provisional patent application No. 62/526,785 filed on Jun. 29, 2017, the content of which is incorporated herein by reference in its entirety.

TECHNICAL FIELD

The present application relates to ferromagnetic devices, and in particular, to a ferromagnetic field effect transconductor device.

BACKGROUND

Over the past few decades, there has been a considerable amount of research conducted on the modelling, characterization, and synthesis of ferromagnetic materials for use in a wide range of applications, such as telecommunication, wireless systems, power inductors and transformers, sensing applications, microwave absorbers, and low loss conductors. Ferromagnetic materials, while deposited as thin films, have shown significant dynamic frequency-dependent properties in frequencies ranging from DC to K-band (18-27 GHz) and can be used as conductors to realize passive components with extraordinary performance. These properties cannot be achieved by conventional conductors (the so-called "metaconductors"). However, because ferromagnetic materials have much lower electrical conductivity and high resistive losses compared to commonly-used high-performance conductor materials like copper or silver, they have not been used as solid conductors in RF components. Therefore there is a need to develop a highly conductive ferromagnetic field device.

SUMMARY

The present disclosure provides a magnetic field effect transconductor that comprises at least a pair of a nano-scale non-ferromagnetic layer and a nano-scale ferromagnetic layer, thereby allowing current modulation or switching to be performed at RF frequencies in a non-contact and wireless magnetic field.

In an embodiment, a magnetic field effect transconductor (M-FET), includes N ferromagnetic layers; and N non-ferromagnetic layers, wherein each non-ferromagnetic is characterized by a first skin depth defined by a current, wherein the non-ferromagnetic layer has a first thickness smaller than the first skin depth; wherein each ferromagnetic layer is characterized by a second skin depth defined by the current, wherein the ferromagnetic layer has a second thickness smaller than the second skin depth; and wherein N is an integer equal to or greater than one.

In another embodiment, a magnetic field effect transconductor (M-FET) includes a first ground line; and a transmission line disposed parallel and next to the first ground line, wherein the transmission line comprises a plurality of pairs formed of a non-ferromagnetic layer and a ferromagnetic layer, and wherein each non-ferromagnetic layer has a first thickness smaller than a first skin depth defined by a current; wherein each ferromagnetic layer has a second thickness smaller than a second skin depth defined by the current, and wherein the transmission line is configured to receive an external magnetic field applied along a longitudinal axis of the transmission line.

In yet another embodiment, a method for manufacturing a magnetic field effect transconductor, the method comprising: providing a non-conductive substrate; depositing a photoresist on the substrate; patterning the photoresist; and depositing nano-superlattice conductors over the photoresist, wherein the nano-superlattice conductors comprise a ferromagnetic layer and a non-ferromagnetic layer, and wherein each of the ferromagnetic layer and the non-ferromagnetic layer has a nano-scale thickness.

In another embodiment, a method for manufacturing a magnetic field effect transconductor includes providing a substrate; depositing nano-superlattice conductors on the substrate; depositing a photoresist on the nano-superlattice conductors; patterning the photoresist; and patterning the nano-superlattice conductors through the photoresist, wherein the nano-superlattice conductors comprise a ferromagnetic layer and a non-ferromagnetic layer, and wherein each of the ferromagnetic layer and the non-ferromagnetic layer has a nano scale thickness.

BRIEF DESCRIPTION OF DRAWINGS

In order to more clearly illustrate technical solutions in embodiments of the present disclosure or in the related art, the accompanying drawings used in the embodiments and in the related art are briefly introduced as follows. Obviously, the drawings described as follows are merely part of the embodiments of the present disclosure, other drawings can also be acquired by those skilled in the art without paying creative efforts.

FIG. 5(b) top chart shows the resistance characteristics of a magnetic field effect transconductor, as a function of the frequencies of an AC magnetic field when various DC magnetic fields are applied in longitudinal (easy) axis of the transconductor.

FIG. 5(b) bottom chart shows resistance characteristic of a magnetic field effect transconductor, as a function of frequencies of an AC magnetic field, when various DC magnetic fields are applied in a non-longitudinal (hard) axis of the transconductor. The inserted figures are a SEM micrograph of the transducer and a diagram of the magnetic fields applied.

DETAILED DESCRIPTION

Figure 1A:
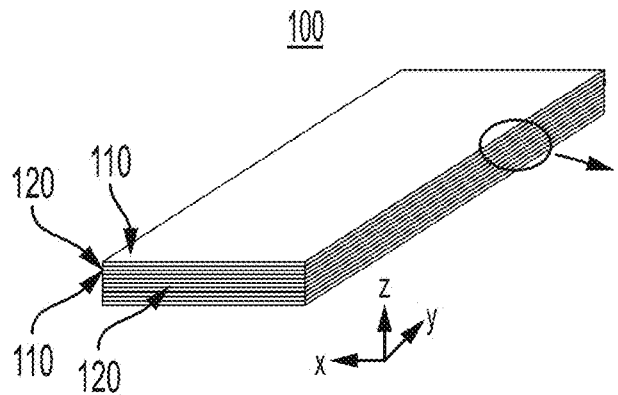
FIG. 1(a) shows a schematic diagram of a magnetic field effect transconductor according to an embodiment of the current disclosure.

In order to clarify the purpose, technical solution details, and advantages of the embodiments of the present disclosure, the embodiments of the present disclosure are clearly and completely described in the following with reference to the accompanying drawings in the embodiments of the present disclosure. Clearly, the described embodiments are merely exemplary embodiments of the present disclosure, therefore shall not be interpreted as limiting the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., An existing individually, A and B existing simultaneously, B existing individually. In addition, the character "/" herein generally indicates that the related objects before and after the character form an "or" relationship.

It should be noted that, the expressions such as "upper", "lower", "left", "right" and the like mentioned in embodiments of the present disclosure are described with reference to the placement status in the accompanying drawings, and should not be construed as limiting embodiments of the present disclosure. In addition, it should also be understood that, in the context, while referring to an element being formed "above" or "below" another element, it is possible that the element is directly formed "above" or "below" the other element, it is also possible that the element is formed "above" or "below" the other element via an intermediate element.

Embodiments of the current disclosure provide novel and advantageous magnetic field effect transconductors that comprise at least one pair of a nano scale non-ferromagnetic layer and a nano scale ferromagnetic layer.

In an embodiment of the current disclosure, a structure includes a multi-layer nano-superlattice architecture, in which ultra-thin ferromagnetic material films and ultra-thin non-ferromagnetic films with relatively high conductivity are alternately arranged in pairs. Such a structure has low resistance in a magnetic field for both DC and AC signals. The disclosed transconductors enable dynamic properties of the ferromagnetic materials to be used in RF conductors and transmission lines with tunable impedance.

Ferromagnetic materials possess frequency dependent properties. Both the real part and the imaginary part of the complex magnetic permeability of ferromagnetic materials show rapid frequency dynamics near a characteristic resonant frequency. When an external oscillating magnetic field (electromagnetic field) increases its oscillating frequency, the real part of the complex magnetic permeability increases to a peak before going through a phase change from positive to negative numbers, with the peak value representing the material's high magnetic alignment. Meanwhile the imaginary part of the magnetic permeability at the phase change of the real permeability shows its peak value. The magnetic field frequency at the peak of the imaginary part of the complex magnetic permeability is the ferromagnetic resonance frequency ($f_{FMR}$), where the real part of magnetic permeability ($\mu_r'$) is zero and the imaginary part ($\mu_r''$)—indicating magnetic losses is high.

Ferromagnetic materials are most commonly used as the magnetic cores of inductors or transformers to increase stored magnetic energy. In these applications the inductance and quality factor are high in the radio frequency (RF) regime often in MHz and GHz frequency ranges. In frequencies much larger than $f_{FMR}$ where the real part of the ferromagnetic materials is negative, ferromagnetic materials could be used for cancelling the self-generated eddy currents inside the conductor and lowering the conductor loss in those frequency ranges. At $f_{FMR}$, the magnetic losses from internal heat dissipation of a ferromagnetic material reach a maximum and the real part of the magnetic permeability becomes zero, and therefore large energy absorption occurs. Because $f_{FMR}$ can be altered by external magnetic field, a device can be fabricated using a magnetic field to control this magnetic property.

In accordance with one aspect of the present invention, a relationship is established between the electromagnetic characteristics of the structure of the disclosed multiple pairs of the nanoscale non-ferromagnetic/ferromagnetic (for example, $Cu/Ni_{80}Fe_{20}$) metallic layers and their tuning functionality near the resonant frequency $f_{FMR}$ in response to an applied magnetic field.

A magnetic field effect transconductor (M-FET) is described which has switchable current in response to an external magnetic field, in accordance with one embodiment of the present invention. As described below, the electrical conductance of non-ferromagnetic film disposed in M-FET can vary as a function of the applied magnetic field.

An M-FET device, in accordance with embodiments of the present invention there does not include semiconductor materials. The multilayer transmission line conductor of the M-FET itself serves as the channel for RF currents. The embedded ferromagnetic layers in the transmission line conductor serve as a magnetic modulator responding to the external wireless magnetic field.

FIG. 1 (a) is a schematic diagram of an M-FET 100 according to an exemplary embodiment of the current disclosure. Exemplary embodiment of M-FET 100 is shown as including five layers of non-ferromagnetic materials 110 and five layers of ferromagnetic materials 120. Other than materials forming the bottom and top layers, the remaining layers are arranged in an alternating manner such that each layer of non-ferromagnetic materials 110 is disposed between two different layers of ferromagnetic materials 120, and each layer of ferromagnetic materials 120 is disposed between two different layers of ferromagnetic materials 120. Although exemplary embodiment 100 is shown as including five layers of non-ferromagnetic materials 110 and five layers of ferromagnetic materials 120, it is understood that an M-FET in accordance with other embodiments, may include N layers of non-ferromagnetic each disposed between a different pairs of M layers of ferromagnetic materials, where M and N are integers that may or may not be equal.

Figure 1B:
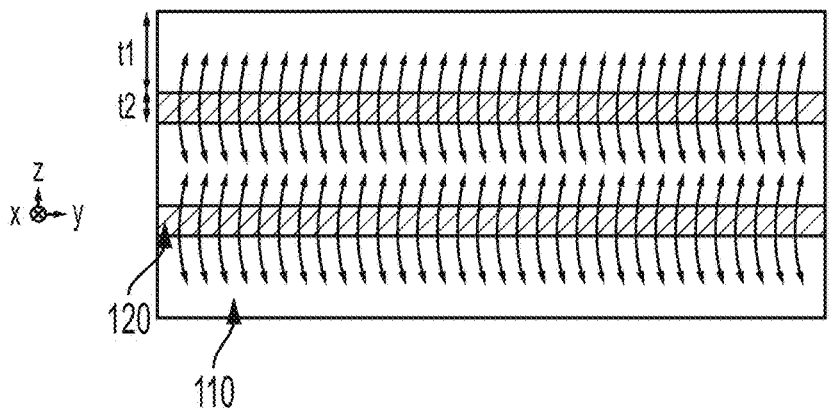
FIG. 1(b) shows a cross sectional view of the magnetic field effect transconductor in FIG. 1(a).

FIG. 1(b) shows an M-FET 100 having 3 layers of non-ferromagnetic layer 110 disposed between 2 layers of ferromagnetic material 120, in accordance with another exemplary embodiment of the present invention. Each non-ferromagnetic layer 110 together with either an overlaying or an underlaying ferromagnetic layer 120 forms a pair of layers. To increase efficiency multiple pairs of alternating layers of ferromagnetic and non-ferromagnetic may be used to form a M-FET device.

In FIGS. 1(a) and 1(b), non-ferromagnetic layers 110 and ferromagnetic layers 120 are shown as extending along y-axis, also referred to herein as an easy axis, and have widths along x-axis. In addition, the non-ferromagnetic layers 110 and ferromagnetic layers 120 are stacked along the z-axis, also referred to herein as the hard axis. The thickness $t_1$ of each non-ferromagnetic layer 110 in the z-axis and a thickness $t_2$ of each ferromagnetic layer 120 (both thicknesses shown along the z-axis) are in nanometer ranges, thereby forming a nano-superlattice conductor. In one embodiment, thickness $t_1$ is larger than thickness $t_2$. Non-ferromagnetic layer 110 may be formed of metals with good conductivity such as, for example, copper (Cu), aluminum (Al), silver (Ag), or gold (Au). Ferromagnetic layer 120 may be formed of ferromagnetic materials such as, for example, a permalloy ($Ni_{80}Fe_{20}$), Co, or FeCo layer.

M-FET 100 is configured to receive an external constant DC magnetic field along the y-axis when an electromagnetic (EM) wave propagates through M-FET in the y-axis. The electrical conductance of M-FET 100 is dependent on the external DC magnetic field that is applied by a device (not shown) and spaced away from M-FET 100. In other words, the operation, including modulation or switching, of M-FET 100 is controlled by a magnetic field generated by a device that is not in contact with M-FET 100. The conductance of device M-FET 100 may be varied also by the M-FET's structural parameters such as (i) thickness $t_1$ of non-ferromagnetic layers (1) 110; (ii) thickness $t_2$ of ferromagnetic layers 120 and/or (iii) the ratio of thicknesses $t_1$ and thickness $t_2$.

When M-FET 100 is subjected to electromagnetic (EM) waves which has the same propagation directions as the direction of the external DC magnetic field applied to M-FET 100, the resultant magnetic moment of the ferromagnetic material (for example, $Ni_{80}Fe_{20}$) layer 120 is forced to process under the spin torque, trying to align with the propagation direction of the EM field, thus causing the EM field to be transferred via the spin torque. This process results in a change of electrical conductance and dissipation as heat. The change in the of conductance or resistance of the M-FET depends on multiple factors such as ferromagnetic materials, film thickness ratio, EM wave frequency and DC magnetic field strength.

In one example, $Ni_{80}Fe_{20}$ is used as a ferromagnetic material in layer 120 to form a tunable resistance on the M-FET. When Copper is used as the non-ferromagnetic material, the impedance of Copper increases as a function of EM wave frequency, while the resistance of the $Cu/Ni_{80}Fe_{20}$ film stack reaches a peak value near the resonance frequency $f_{FMR}$.

In one embodiment, the M-FET resonance frequency $f_{FMR}$ is tunable in a dynamic range from 1 GHz to 7 GHz by applying different external DC magnetic fields ranging from 0 to 600 Oersted (Oe). This effect can be favorably used in applications where an increased ohmic resistance is required, and a longer transmission line is used for the realization of tunable RF loads for the above-mentioned frequency ranges. The dynamic response of the transmission lines (e.g., the copper layers in the above example) can be extracted and is tunable in response to an external magnetic field applied longitudinally through the easy axis of the transmission lines. A comparison between the theoretical permeability values calculated from the Landau-Lifshitz-Gilbert (LLG) model and the experimental data from the resistance measurements at resonance peaks is provided in FIG. 6(a).

The precise mechanisms of interactions among the magnetic moments of magnetic dipoles in a ferromagnetic material have been investigated theoretically. The Landau-Lifshitz-Gilbert (LLG) dynamic model shown in equation (1) below describes the time evolution of the magnetic moment per unit volume of a ferromagnetic material. Equation (1) below includes two terms (Reference publication by V. B. Bregar, *Advantages of ferromagnetic nanoparticle composites in microwave absorbers*, IEEE Transactions on Magnetics, 40.3 (2004) pp. 1679-1684). The complex permeability of the ferromagnetic materials as a function of the field frequency f extracted from the solution of the LLG may be described as shown below: the real and imaginary term of the solution represents the magnetic energy storage capability and the ferromagnetic loss, respectively.

$$\mu_r = \left\{1 + \gamma^2 4\pi M_s + \frac{[H_{Kp} - H_{Ku} + 4\pi M_s + j\omega\alpha/\gamma]}{\gamma^2 H_{Kp}[H_{Kp} - H_{Ku} + 4\pi M_s] - \omega^2 + j\omega\alpha\gamma[2H_{Kp} - H_{Ku} + 4\pi M_s]}\right\} \frac{\tanh[(1+j)t/(2\delta)]}{(1+j)t/(2\delta)} \quad (1)$$

In equation (1) $M_s$ is the magnetization moment at saturation, $H_{kp}$ is the in-plane anisotropic field, $H_{ku}$ is the out-of-plane anisotropic field, $\gamma$ is the gyromagnetic ratio, $\alpha$ is the Gilbert damping ratio, t is the thickness of the ferromagnetic thin film, $\delta$ is its skin depth of the ferromagnetics, and $\omega$ is the angular frequency of the effective electromagnetic field. Permalloy ($Ni_{80}Fe_{20}$) is one of the most commonly studied and utilized soft magnetic materials. The in-plane magnetization of a thin film permalloy has a complex permeability spectrum $\mu_r$ (f) expressed as: $\mu_r(f)=\mu'_r(f)-j\mu''_r(f)$, where $\mu'_r(f)$ is the real part of $\mu_r(f)$, and $\mu''_r(f)$ is the imaginary part, and $\mu_r$ (f) is calculated by using equation (1).

As was described above, when an electromagnetic field H, perpendicular to an existing DC magnetic field is applied to a ferromagnetic material, the magnetic moment of domaindipoles in the ferromagnetic material goes through a processing movement under a spinning torque while trying to align itself to the external DC magnetic field. The process movement is damped from the material's internal dissipation. When the frequency of the electromagnetic wave approaches the natural precession frequency of the material's magnetic moment, the ferromagnetic resonance occurs. The ferromagnetic material experiences the largest electromagnetic energy transfer through its dipole spin torque, leading to a maximum energy absorption by the ferromagnetic material. The magnitude of the absorption is related to the imaginary part of the complex permeability of the ferromagnetic material. The B-H magnetic characterization data of the ferromagnetic material is used to obtain the dynamic response in equation (1).

Figure 2A:
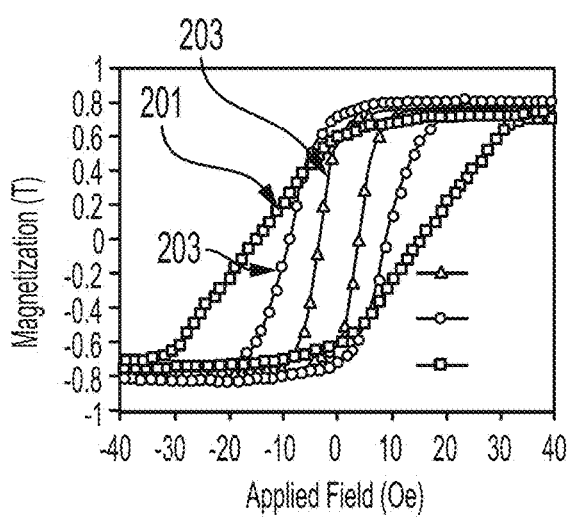
FIG. 2(a) shows B-H hysteresis loop measurement of three magnetic field effect transconductors according to an embodiment of the current disclosure.

FIG. 2(a) shows B-H hysteresis loop measurements of three M-FETs which are fabricated according to an embodiment of the current disclosure. In FIG. 2(a) the characteristic B-H hysteresis loops are shown for three samples each with 10 pairs of $Cu/Ni_{80}Fe_{20}$ layers with three different thickness ratios between the Cu film and the $Ni_{80}Fe_{20}$ film. Plot 201 is a magnetization plot of a sample having a non-ferromagnetic to ferromagnetic thickness ratio of 360 nm/30 nm. Plot 202 is a magnetization plot of a sample having a non-ferromagnetic to ferromagnetic thickness ratio of 180 nm/30 nm. Plot 203 is a magnetization curve of a sample having a non-ferromagnetic to ferromagnetic thickness ratio of 180 nm/60 nm. Data points were acquired by performing vibrating sample magnetometer (VSM) measurements. The samples may have an intrinsic in-plane anisotropic field of 5 Oe to 20 Oe, an out-of-plane anisotropic field of 250 Oe, and a magnetization saturation of 0.9 Tesla (using ADE Technologies' recipe EV9 with a maximum applied field of ±1800 kA $m^{-1}$).

Figure 2B:
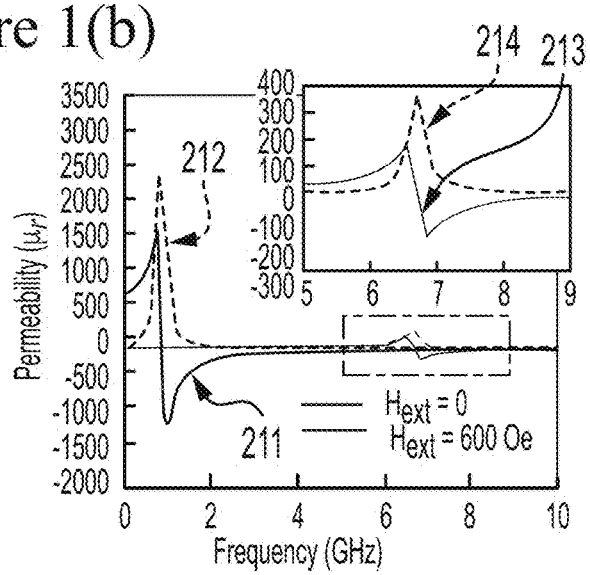
FIG. 2(b) shows the real and imaginary permeability spectra of a magnetic field effect transconductor versus an AC magnetic field frequency according to an embodiment of the current disclosure.

FIG. 2(b) shows the permeability spectra of an M-MFET fabricated according to an embodiment of the current disclosure. In FIG. 2(b) the measured dynamic response from the B-H characterization measurements on a $Cu/Ni_{80}Fe_{20}$ sample is plotted versus sweeping field frequencies when the external DC magnetic field is off ($H_{ext}=0$) and when the DC magnetic field is on ($H_{ext}=600$ Oe). The Gilbert damping ratio of 0.01, which is typical of this type of ferromagnetic samples, is used and the skin depths of films, δ, are calculated by using the electrical conductivities of $Ni_{80}Fe_{20}$ and Cu where $\sigma_{NiFe}=6\times10^6$ S/m (siemens per meter) and $\sigma_{Cu}=5.8\times10^7$ S/m, respectively. The real parts of the complex permeability are shown as solid lines (plots 211 for zero-field and 213 for non-zero field $H_{ext}=600$ Oe) and the imaginary parts of the complex permeability are shown as dashed lines (plots 212 for zero field and 214 for non-zero field of $H_{ext}=600$ Oe) respectively, in the field frequency range of 0 to 10 GHz. FIG. 2(b) depicts the dynamic response when an applied DC magnetic field set at 0 and at 600 Oe. Because of the relatively small intrinsic in-plane anisotropic fields of the $Ni_{80}Fe_{20}$ layers at most applicable thickness ratios (all below 20 Oe), the magnetic moments of the samples may not be well aligned and are assumed as being relatively random. As shown the ferromagnetic resonance frequency is widely tunable from 900 MHz to 7 GHz upon the external DC magnetic field.

Figure 3A:
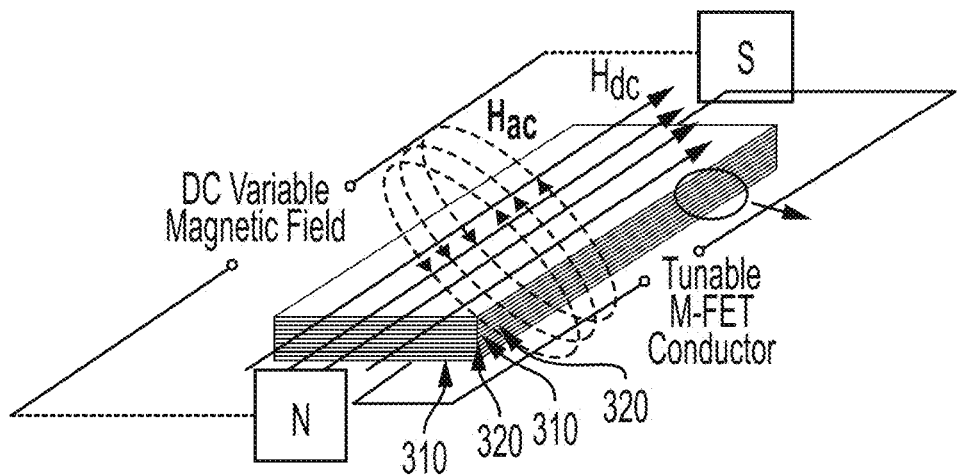
FIG. 3(a) shows a schematic diagram of a tunable magnetic field effect transconductor according to an embodiment of the current disclosure.
Figure 3B:
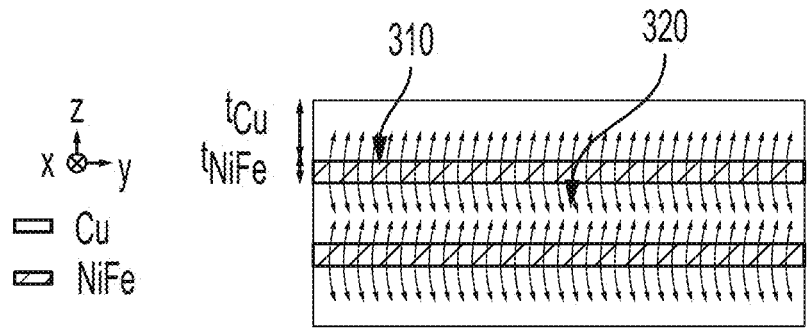
FIG. 3(b) shows a schematic diagram of a cross sectional view of the tunable magnetic field effect transconductor shown in FIG. 3(a).

The tuning capability of $Ni_{80}Fe_{20}$ layers (films) is used in M-FETs, in accordance with embodiments of the present invention. FIG. 3(a) shows a tunable M-FET having 10 pairs of $Cu/Ni_{80}Fe_{20}$ layers according to an embodiment of the current disclosure. Layers 310 as non-ferromagnetics, and 320 as ferromagnetics are examplenary layers of alternating ferromagnetic and non-ferromagnetic thin films. For simplicity, not all 10 layers are labelled in FIG. 3(a). FIG. 3(b) is a cross-sectional view of the three of layers 320 and two of the layers 310 of FIG. 3(a). The Cu layer 310 is assumed to have a thickness $t_{Cu}$ of 180 nm, and $Ni_{80}Fe_{20}$ layer 320 is assumed to have a thickness $t_N$ of 30 nm. Both $t_{Cu}$ and $t_N$ are thus thinner than the skin depths of the electric current near resonance frequencies $f_{FMR}$. The copper film is known to have skin depths $\delta_{Cu}$, of 2 μm at 1 GHz, and 780 nm at 7 GHz. The $Ni_{80}Fe_{20}$ layers in proximity of the Cu layers absorb the electromagnetic energy transferred from the magnetic dipole spin torque when the external DC magnetic field is perpendicular to the AC magnetic field of the electromagnetic wave, resulting in an increased effective resistance of the total conductor. As the spin torque transfer mechanism is maximized near the $f_{FMR}$ frequency (see, e.g., in FIGS. 2(a) and 2(b)), the conductance of the conductors (e.g., layer 320 of FIG. 3(a)) of the M-FET exhibits frequency-dependent behavior. At the same time, the multiple Cu layers provide parallel current paths lowering down the total resistance of the conductor. Therefore, a conductor which has a low ohmic resistance in all frequencies, except a high resistance in a narrow tunable frequency band, is formed.

The M-FET conductor, according to the exemplary embodiments of the current disclosure, operates as a conductor of an electromagnetic waveguide (i.e., pre-integrated or embedded in part of a waveguide, not requiring extra space for external reflectors and filters to realize the same functions). A variable DC magnetic field $H_{dc}$ of FIG. 3(a) is used to tune the M-FET's $f_{FMR}$ and ohmic resistance peak point, therefore facilitating non-contact remote tuning or wireless tuning.

As the ferromagnetic resonance tuning of the ferromagnetic materials is used as the dominant loss mechanism, the amount of the ferromagnetic materials used affects the total amount of energy transfer. The thicknesses ratio between the ferromagnetic material and the non-ferromagnetic material impacts the contrast of the resistance at $f_{FMR}$ and off-$f_{FMR}$.

The M-FET structures use pure metals (e.g., Cu and NiFe), instead of a semiconductor material such as Si, GaAs, or GaN, as a current flow medium, and display a field-dependent ohmic resistance. The pure-metal-based transconductor has a much higher speed and significantly reduced noise associated with hole and electron recombination that occur in semiconductor devices. The M-FETs have relatively very thin ferromagnetic materials to alternate the current distribution flow in the microwave regime, which enables compact magnetic devices. Modulation or switching of an M-FET can be performed in a non-contact and wireless magnetic field.

The device operates as an active current switch where high frequency current mainly flows in the conductive non-ferromagnetic layers, whose electrical conductance can be modulated with an external magnetic field by the spin torque energy transfer between the ferromagnetic layers on top and bottom of the current-carrying non-ferromagnetic layers and the current-carrying non-ferromagnetic layers. The multiple layers in an M-FET enable it to carry higher current and handle higher power. Coupled with the magnetically tunable ohmic resistance at GHz range, an M-FET can be switched on/off at very high frequencies by an external magnetic field. Thus the M-FET device concept extends its features from a passive element to a potential active device with faster and higher power handling capabilities.

The electromagnetic tunability has been experimentally characterized (see the Example section) and the electromagnetic field frequency and loss response have been described in text related to FIGS. 2(a) and 2(b) and the LLG equation (1). In the experiments, conductors made of 10 pairs of $Cu/Ni_{80}Fe_{20}$ thin films were fabricated in the coplanar waveguide configurations. Magnetically tunable ohmic resistances in S and C bands (IEEE 2-8 GHz) have been demonstrated. Because the imaginary part of the complex permeability, representing magnetic losses, is at a maximum at resonance frequency $f_{FMR}$, high ferromagnetic losses contribute towards an increased conductor loss near the resonance frequency. Also, the thickness ratio of the $Cu/Ni_{80}Fe_{20}$ in the superlattice conductor has been experimentally demonstrated to affect the resonant ohmic resistance near $f_{FMR}$. This effect can be used for applications where an increased ohmic resistance is demanded such as in resonators, microwave absorbers, or notch filters. Longer transmission lines can be used for the realization of the tunable transmission lines or RF loads with variable impedances. The disclosure includes, but is not limited to, the following examples.

Example 1

Figure 4A:
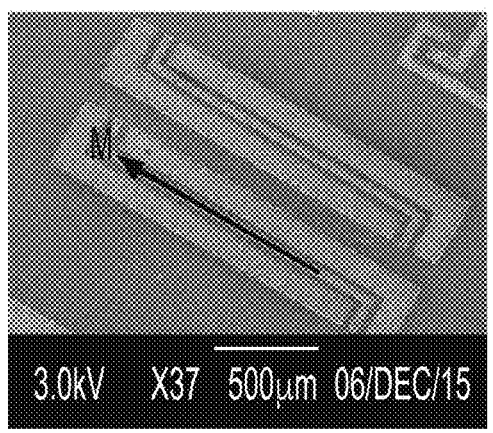
FIG. 4(a) shows a scanning electron microscope (SEM) micrograph of a magnetic field effect transconductor according to an embodiment of the current disclosure.

A magnetic field effect transconductor was manufactured such that it comprised a plurality of pairs of a nano-scale non-ferromagnetic layer and a nano-scale ferromagnetic layer. Conductors made of 10 paired $Cu/Ni_{80}Fe_{20}$ thin films were nano machined on a glass substrate (using SGW3, Corning Inc. with a thickness of 300 μm and a coefficient of thermal expansion (CTE) of $3.17 \times 10^{-6}/°$ C.). The glass substrate had an excellent surface smoothness (<1.0 nm of roughness) suitable for the implementation of the nano-superlattice conductors. The $Cu/Ni_{80}Fe_{20}$ pairs were deposited using DC/RF sputtering, (CMS-18, Kurt J. Lesker Inc.), ALD (atomic layer deposition), thermal/e-beam evaporation, electro-deposition, electroless deposition over photolithographically patterned photoresist on the glass substrate, followed by a lift-off process. Coplanar waveguide (CPW) transmission lines with a length of 2 mm and a signal line width of 60 μm were used as test vehicles to demonstrate the concept of the tunable conductors. FIG. 4(a) shows a scanning electron microscope (SEM) micrograph of the fabricated coplanar waveguide transmission lines in the magnetic field effect transconductor according to an embodiment of the current disclosure.

Figure 4B:
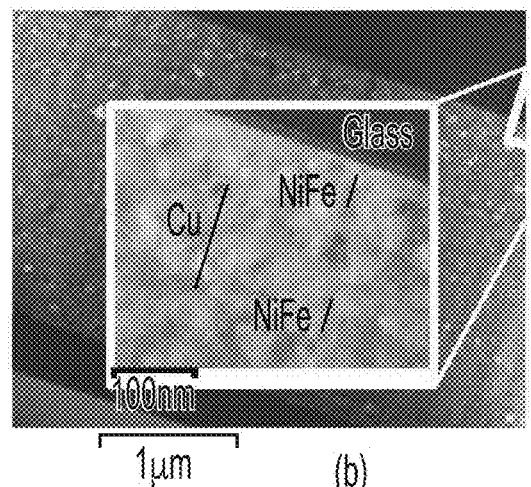
FIG. 4(b) shows a cross-sectional transmission electron microscopy (TEM) micrograph of the magnetic field effect transconductor in FIG. 4(a).

FIG. 4(b) shows a cross-sectional transmission electron microscopy (TEM) micrograph of the nano-layers of Cu and NiFe in a magnetic field effect transconductor similar to those in FIG. 4(a). The thickness of $Ni_{80}Fe_{20}$ was chosen smaller than its skin depth, so to keep the majority of current flow in Cu layers, except when we have to take into account the magnetic spin torque energy transfer effect peak in the thin $Ni_{80}Fe_{20}$ layers near $f_{FMR}$ frequencies. Vector $\vec{M}$ in FIG. 4(a) points to the direction of magnetization along where external DC magnetic field is applied.

Referring to FIG. 4(b), a Ti layer is deposited on the glass substrate for adhesion, the $Ni_{80}Fe_{20}$ layer is deposited on the Ti layer, and the Cu layer is deposited on the $Ni_{80}Fe_{20}$ layer. The $Ni_{80}Fe_{20}$ layer and the Cu layer are repeatedly deposited above each other.

Figure 5A:
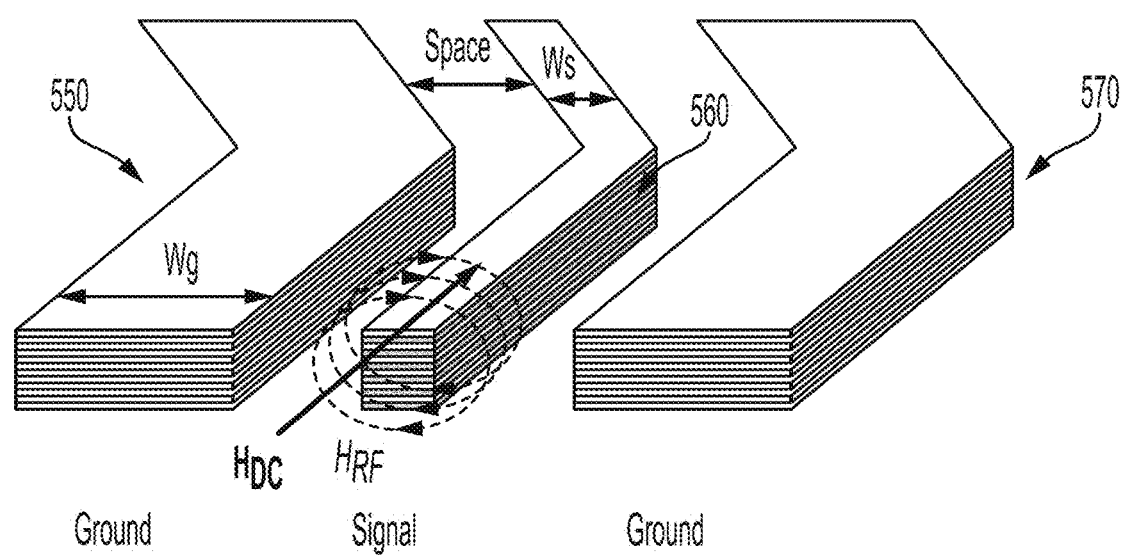
FIG. 5(a) shows a schematic structure of a magnetic field effect transconductor in a combined DC and RF (AC) magnetic field according to an exemplary embodiment of the current disclosure.

FIG. 5(a) shows a schematic structure of a magnetic field effect transconductor in a combined DC and RF (AC) magnetic field $H_{DC}$ and $H_{RF}$, according to an exemplary embodiment of the current disclosure. A signal line conductor 560 is sandwiched between two ground conductors 550 and 570, spaced away from the signal line 560. The signal line 560 is formed of multiple layers of non-ferromagnetics 110 and ferromagnetics 120 disclosed in FIG. 1(a). Ground lines 550 and 570 each has width Wg, but the width does not have to be equal. Signal like 560 has width Ws, typically smaller than a ground line's width. Ground lines are formed of conductors having multi-layers of ferromagnetics and non-ferromagnetics, similar to the signal line. DC magnetic field $H_{DC}$ is applied in the longitudinal direction (easy axis) of the signal line 560, and RF (AC) magnetic field $H_{RF}$ is applied to the signal line 560 propagating in the longitudinal direction of the signal line 560.

RF measurements for the magnetic field effect transconductor have been performed by a vector network analyzer (model E5071, Agilent Inc.) following a standard short-open-load-through (SOLT) two-port calibration process between 10 MHz and 20 GHz. A Cascade Microtech probe station and ground-signal-ground (GSG) probes (at 150 μm pitch) are used for testing the $Cu/Ni_{80}Fe_{20}$ coplanar waveguide patterns which have the same footprint dimensions but different film thicknesses.

Figure 5B:
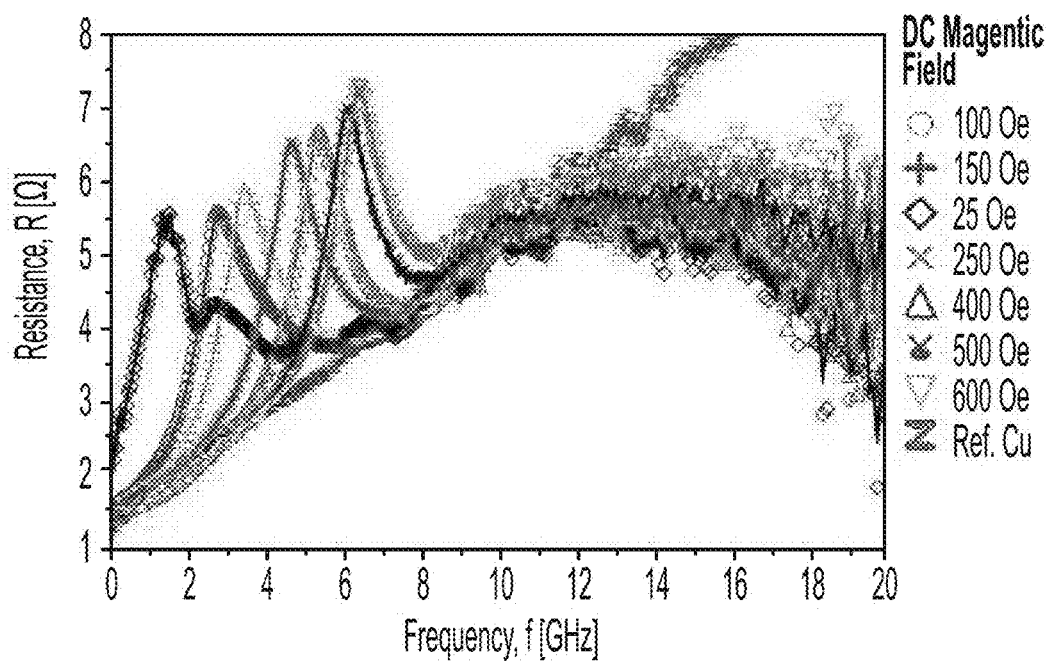
Figure 5B:
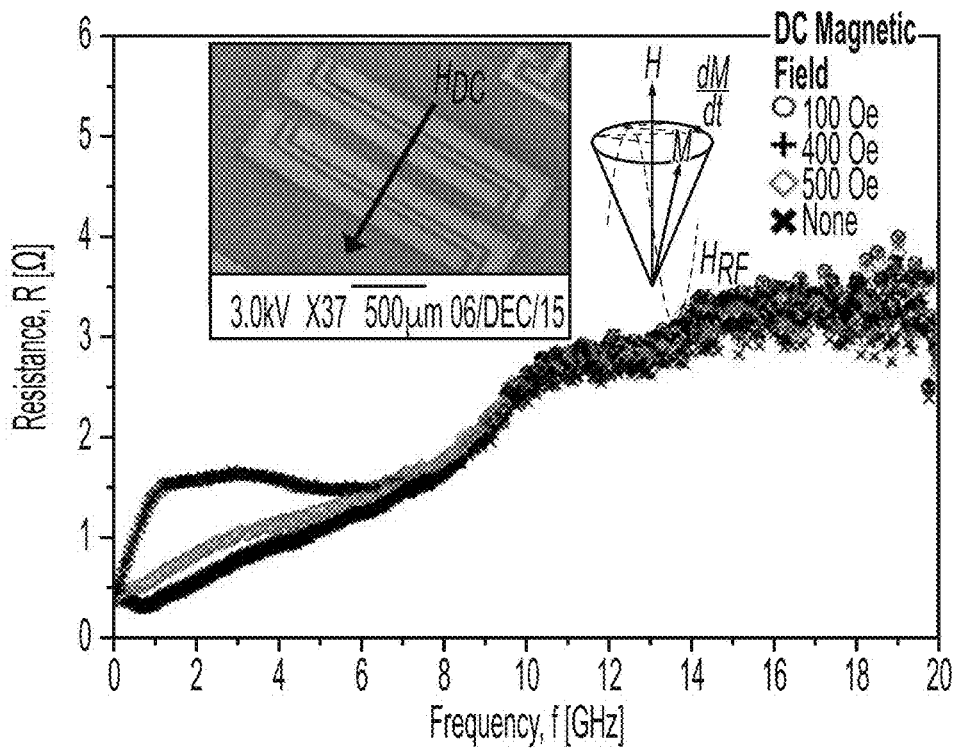

FIG. 5(b) top chart shows the resistance characteristics of a magnetic field effect transconductor, as a function of the frequencies of an AC magnetic field when various DC magnetic fields are applied in longitudinal (easy) axis of the transconductor.

The measured RF resistance responses in different DC magnetic fields of M-FET1, made of 10 pairs of 180 nm/30 nm $Cu/Ni_{80}Fe_{20}$, are plotted in comparison to the reference Cu conductor. Two ports of the coplanar waveguide transmission lines are 90° rotated in order to make it feasible to establish the magnetic field setup during testing. A variable DC magnetic field is applied along the easy and hard axes of the transmission lines. The measurement results with an external DC magnetic field from 25 Oe up to 600 Oe are displayed. A PI-type lumped-element equivalent circuit model is considered to extract the ohmic series resistance of the transmission lines. Referring to FIG. 5(b) top, when a DC magnetic field is applied along the easy axis of the transmission line, it is perpendicular to the instantaneous alternating RF electromagnetic field, with propagation direction parallel to the DC magnetic field, applied on the transmission line. Therefore, the spin torque forces the magnetic moment of the ferromagnetic material's dipole spin into a processing movement trying to align to the external DC magnetic field. This transfer energy from spin torque to the magnetic moment is demonstrated as dissipation and is the source of the ferromagnetic resonance loss.

In order to further study this phenomenon, a measurement is performed to verify the spin torque transfer in out-of-plane direction (hard axis) of the ferromagnetic film.

FIG. 5(b) bottom chart shows resistance characteristic of the exemplary M-FET conductor of $Cu/Ni_{80}Fe_{20}$ (360 nm/30 nm), as a function of frequencies of an AC electromagnetic field, when various DC magnetic fields are applied in non-longitudinal axis (hard axis) of the transconductor. The inserted figures are, on the left, a SEM micrograph of the transducer and on the right, a diagram of the magnetic fields applied. In the left inserted SEM, the signal line of the transmission line is located between two ground lines, and the width Ws of the signal line is smaller than the width Wg of each ground line.

In FIG. 5(b) bottom chart, the DC magnetic field varied from 100 Oe to as high as 550 Oe; however, since it is applied out-of-plane, no noticeable change in the extracted resistance of the transmission lines was observed as expected.

As was predicted by the LLG theory shown in FIG. 2(b), the resonance frequency $f_{FMR}$ of the ferromagnetic films are variable based upon the applied DC magnetic field along their easy axis. As a result, their magnetic losses near $f_{FMR}$ will contribute towards the increased ohmic resistances of the transmission lines, which results in a resonance peak in the imaginary part of the complex permeability and this resonance frequency is tunable as a function of the applied DC magnetic field up to 6.7 GHz (at 600 Oe of DC magnetic field). Because the ferromagnetic layers are selected thin enough (30 nm), at non resonance frequencies off-$f_{FMR}$ the extracted ohmic resistance of the conductor approaches the ohmic resistance of the regular solid reference Cu conductor, while a magnetic-field-dependent peak resistance occurs at $f_{FMR}$, revealing the realization of frequency-selective conductors. At frequencies above 10 GHz, when the magnitude of the real part of the complex permeability $|\mu'_{r,NiFe}|$ approaches 6, same as the Cu/NiFe thickness ratio of 6 in this sample, the effective resistance of the conductor made of 10 pairs of Cu/NiFe actually decreases as shown in FIG. 5(b) top, and falls below that of the reference Cu conductors, as a result of the eddy current cancelling effect kicking in at a high frequency oscillating magnetic field. In general the fabricated Cu/Ni$_{80}$Fe$_{20}$ conductors show an increased RF resistance for below 10 GHz and a decreased RF resistance for above 10 GHz frequencies. Conductors reaching this high frequency stage are called "metaconductors". In summary of our experiments: below 10 GHz, the RF resistance of the multi-layer conductors is frequency-tunable from about 1 GHz to 7 GHz (a tuning range of 700%) in an external DC magnetic field from zero to 600 Oe, and we obtained an increased ohmic resistance of up to 200% larger than the reference Cu conductor. Above 10 GHz, the metaconductors have a reduced RF resistance, suitable for high performance RF devices with suppressed conductor losses for Ku band (IEEE 12-18 GHz) and K band (IEEE 18-27 GHz). As shown in FIG. 5(b) top graph, applying an external DC magnetic field shifts the peak point of the imaginary part of the complex permeability of the 30 nm Ni$_{80}$Fe$_{20}$ thin film towards higher frequencies, while the amplitude of ohmic resistance at resonance decreases. This can be estimated by the LLG theory and equation (1).

In order to investigate the effects of the thicknesses, three M-FETs with different thickness ratios were formed. The first M-FET (M-FET1) is formed with a Cu layer of 180 nm and Ni$_{80}$Fe$_{20}$ layer of 30 nm. The second M-FET (M-FET2) is formed with a Cu thickness of 360 nm and a Ni$_{80}$Fe$_{20}$ thickness of 30 nm. The third M-FET (M-FET 3) is formed with a Cu thickness of 180 nm and a Ni$_{80}$Fe$_{20}$ thickness of 60 nm. Advantageous features of the M-FETs made according to the disclosed embodiments are explained in the following.

Figure 5C:
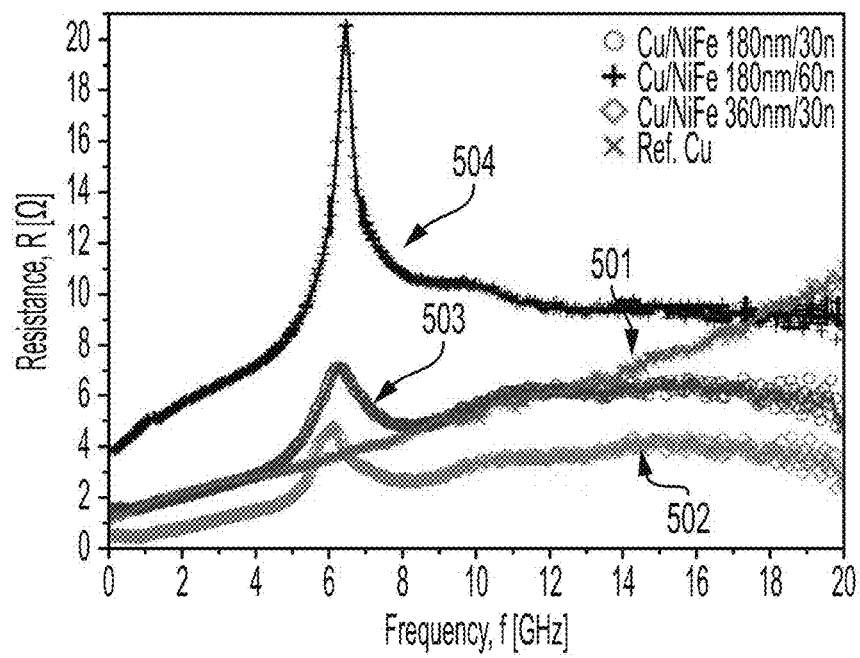
FIG. 5(c) shows resistance characteristic of the magnetic field effect transconductors with various film thickness ratios, as a function of frequencies of an AC magnetic field, when a number of DC magnetic fields are applied in the longitudinal (easy) axis.

FIG. 5(c) shows resistance characteristics of the magnetic field effect transconductors of various film thickness ratios, as a function of frequencies of an AC electromagnetic field, for a number of DC magnetic fields applied in longitudinal (easy) axis.

In FIG. 5(c), the tunability of three M-FET devices with different Cu/Ni$_{80}$Fe$_{20}$ thickness ratios in a constant applied DC magnetic field is demonstrated comparing with a Cu film as the baseline represented by curve 501. Curve 502 represents resistivity of M-FET2 with $t_{Cu/NiFe}$=360 nm/30 nm, curve 503 represents resistivity of M-FET1 with $t_{Cu/NiFe}$=180 nm/30 nm, and curve 504 represents resistivity of M-FET3 with $t_{Cu/NiFe}$=180 nm/60 nm. All samples are measured using the same test setup under an applied DC magnetic field of 550 Oe. Since the same ferromagnetic material is used for all three devices, the peaks of the ohmic resistance occur at about the same frequencies for all samples (not Cu). However, M-FET2 represented by 502 with a Cu/Ni$_{80}$Fe$_{20}$ thickness of 360 nm/30 nm has the lowest ohmic peak since it has the highest thickness ratio (more Cu) and the Cu layers are less affected by the NiFe layers. M-FET 3 represented by 504 consisting of a Cu/Ni$_{80}$Fe$_{20}$ thickness of 180 nm/60 nm gives the highest ohmic peak where more than 6 times ohmic resonance contrast (>600%) at 6.5 GHz has been recorded with respect to the solid reference Cu conductor. The Cu/NiFe thickness ratio is like a dopant concentration in an analogy to a semiconductor transistor.

Therefore, modifying the thickness ratio changes the magnitude of the ohmic resistance peak and thus the transconductor parameters like contrast, signal strength, etc.

Figure 6A:
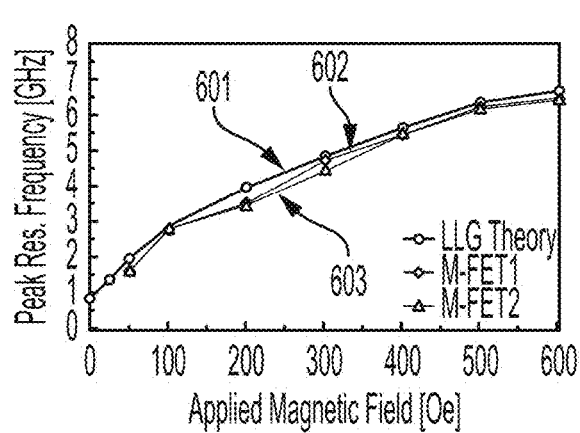
FIG. 6(a) shows the resonance frequency at peak resistance as a function of the external DC magnetization field, comparing those calculated by the Landau-Lifshitz-Gilbert (LLG) dynamic model, and those measured on a couple of the magnetic field effect transconductors according to an embodiment of the current disclosure.

FIG. 6(a) shows a comparison of theory and measurements of the parameter resonance frequency at peak resistance as a function of the external DC magnetization field. Theoretical calculation, represented by 601 using the Landau-Lifshitz-Gilbert (LLG) dynamic model is compared with data, represented by 602 (M-FET1) and 603 (M-FET2) measured on a couple of the magnetic field effect transconductors made according to an embodiment of the current disclosure.

As shown in FIG. 6(a), close correlation is demonstrated between the calculated resonance frequencies at peak resistance of $|\mu''_{r,NiFe}|$ at $f_{FMR}$ from the LLG model and the measured resonance frequencies from the transmission lines shown in FIG. 6(a). The calculated and experimental results match very well between 1 GHz and 7 GHz.

Figure 6B:
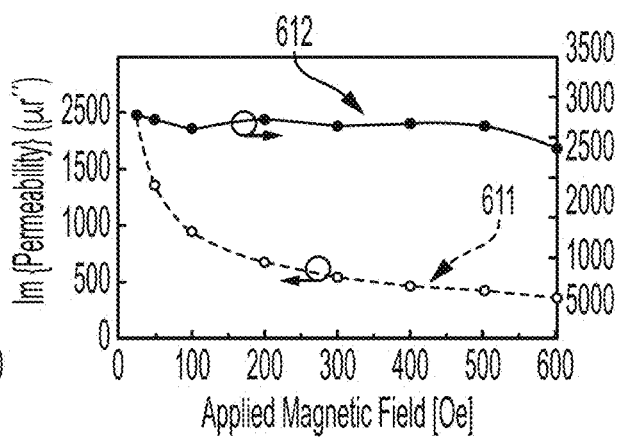
FIG. 6(b) shows, to the left axis, characteristics of an imaginary permeability value of a magnetic field effect transconductor at resonance frequency (at peak resistance); and to the right, its maximum loss, both as functions of an applied DC magnetic field, according to an embodiment of the subject invention.

FIG. 6(b) shows characteristics of the imaginary permeability values at resonance frequency represented by 611 (at peak resistance) to the left axis, and related maximum loss, represented by 612, to the right axis, as a function of applied DC magnetic field, of a magnetic field effect transconductor according to an embodiment of the subject invention.

In particular, in FIG. 6(b) to the left axis, the peak imaginary value 611 of the magnetic permeability $|\mu''_{r,NiFe}|$ drops as a function of the applied DC magnetic field, and to the right axis, the products 612 of the peak imaginary magnetic permeability and the peak frequency $|\mu''_{r,NiFe}| \times f_{FMR}$ remains almost constant for all the applied DC magnetic fields.

This product represents the maximum loss associated with the ferromagnetic material dissipation, which is independent of the frequency in this range. The resistance of a superlattice M-FET conductor consists of two resistance components: the skin effect based ohmic resistance and the ferromagnetic resonance absorption based resistance (due to spin-torque energy transfer). The skin effect based resistance increases as the frequency increases up to 10 GHz as shown in top chart of FIG. 5(b). The trend is very similar to that of solid copper before the eddy current canceling effect occurs at 10 GHz. It starts to decrease as the frequency exceeds 10 GHz as the skin effect suppression by eddy current canceling becomes effective, as previously discussed about the metaconductors. The ferromagnetic resonance based resistance, however, remains constant as the magnetic field frequency increase as shown in FIG. 5(b) top chart and FIG. 6(b). When the external DC magnetic field increases, more magnetic dipoles in the ferromagnetic material are aligned faster and staying aligned for longer period under the stronger centrifugal spin torque by the combined DC and AC fields, when less magnetic dipoles are flipping over with the AC electromagnetic field. So the maximum loss associated with the ferromagnetic resonance, roughly calculated by multiplying the maximum resistance and the frequency, is fixed.

It should be understood that the examplenary embodiments described herein are for illustrative purposes only and that various modifications or changes in light thereof will be suggested to persons skilled in the art and are to be included within the spirit and purview of this application.

What is claimed is:

1. A magnetic field effect transconductor (M-FET) comprising:
   N ferromagnetic layers; and
   N non-ferromagnetic layers,
   wherein each non-ferromagnetic layer is characterized by a first skin depth defined by a current, wherein the non-ferromagnetic layer has a first thickness smaller than the first skin depth;
   wherein each ferromagnetic layer is characterized by a second skin depth defined by the current, wherein the ferromagnetic layer has a second thickness smaller than the second skin depth; and
   wherein N is an integer equal to or greater than one.

2. The magnetic field effect transconductor according to claim 1, wherein the non-ferromagnetic layer and the ferromagnetic layer are metal layers.

3. The magnetic field effect transconductor according to claim 2, wherein the non-ferromagnetic layer is a pure metal wherein the non-ferromagnetic layer is selected from a group consisting of copper, silver, and gold.

4. The magnetic field effect transconductor according to claim 2, wherein the ferromagnetic layer is selected from a group consisting of NiFe, Co, CoFe, FePt, or CoPt.

5. The magnetic field effect transconductor according to claim 2, wherein the second thickness of the ferromagnetic layer is smaller than the first thickness of the non-ferromagnetic layer.

6. The magnetic field effect transconductor according to claim 1, wherein N is an integer greater or equal to 2, and wherein the non-ferromagnetic layers and the ferromagnetic layers are alternatingly arranged; wherein at least one of the ferromagnetic layers is disposed between a pair of non-ferromagnetic layers, and at least one of the non-ferromagnetic layers is disposed between a pair of ferromagnetic layers.

7. The magnetic field effect transconductor according to claim 1, wherein an external magnetic field applied to the transconductor comprises a DC magnetic field; wherein the DC magnetic field is applied along a longitudinal direction of the magnetic field effect transconductor.

8. The magnetic field effect transconductor according to claim 7, wherein the external magnetic field further comprises an AC magnetic field of an electromagnetic wave propagating along the same direction as the DC magnetic field.

9. The magnetic field effect transconductor according to claim 8, wherein the AC magnetic field of the electromagnetic wave is preferred to be substantially perpendicular to the external DC magnetic field at all times.

10. The magnetic field effect transconductor according to claim 1, further comprising a nonconductive substrate and a Ti layer between the substrate and the ferromagnetic layer.

11. A magnetic field effect transconductor (M-FET), comprising:
    a first ground line; and
    a transmission line disposed parallel and next to the first ground line,
    wherein the transmission line comprises a plurality of pairs of a non-ferromagnetic layer and a ferromagnetic layer;
    wherein each non-ferromagnetic layer is characterized by a first skin depth defined by a current, wherein the non-ferromagnetic layer has a first thickness smaller than the first skin depth;
    wherein each ferromagnetic layer is characterized by a second skin depth defined by the current, wherein the ferromagnetic layer has a second thickness smaller than the second skin depth; and
    wherein the transmission line is configured to carry a current when receiving an external magnetic field.

12. The magnetic field effect transconductor according to claim 11, wherein the plurality of pairs of the non-ferromagnetic layer and the ferromagnetic layer make nano-superlattice conductors.

13. The magnetic field effect transconductor according to claim 11, wherein the external magnetic field comprises an external DC magnetic field applied substantially along a longitudinal axis of the transmission line, and an external AC electromagnetic field propagating in the longitudinal axis of the transmission line.

14. The magnetic field effect transconductor according to claim 11, wherein the non-ferromagnetic layer is a copper layer and the ferromagnetic layer is a permalloy (NiFe) layer.

15. The magnetic field effect transconductor according to claim 14, wherein a thickness of the copper layer is larger than a thickness of the NiFe layer.

16. The magnetic field effect transconductor according to claim 11, wherein a width of the first ground line is larger than a width of the transmission line.

17. The magnetic field effect transconductor according to claim 11, further comprising a second ground line disposed parallel to the transmission line such that the transmission line is disposed between the first ground line and the second ground line.

18. The magnetic field effect transconductor according to claim 17, wherein each of the first ground line and the second ground line includes the copper layer and the NiFe layer.

19. The magnetic field effect transconductor according to claim 11, wherein the external magnetic field is applied by a device spaced apart from the magnetic field effect transconductor.

* * * * *